United States Patent [19]
Wong et al.

[11] Patent Number: 5,295,079
[45] Date of Patent: Mar. 15, 1994

[54] DIGITAL TESTING TECHNIQUES FOR VERY HIGH FREQUENCY PHASE-LOCKED LOOPS

[75] Inventors: Hee Wong; Tsun-Kit Chin, both of San Jose, Calif.

[73] Assignee: National Semiconductor Corporation, Santa Clara, Calif.

[21] Appl. No.: 731,963

[22] Filed: Jul. 18, 1991

[51] Int. Cl.$^5$ .................................. G01R 23/02
[52] U.S. Cl. ........................ 364/484; 324/73.1; 364/481; 364/480
[58] Field of Search .............. 364/481, 579, 580, 484; 324/73.1; 371/15.1, 22.5, 20.4

[56]  References Cited
U.S. PATENT DOCUMENTS

| | | | |
|---|---|---|---|
| 4,563,657 | 1/1986 | Quereshi et al. | |
| 4,682,116 | 7/1987 | Wolaver et al. | |
| 4,701,920 | 10/1987 | Resnick et al. | 371/22.5 |
| 4,804,964 | 2/1989 | Takai et al. | |
| 4,816,750 | 3/1989 | van der Kloot et al. | 324/73.1 |
| 4,821,293 | 4/1989 | Shimizume et al. | |
| 4,829,237 | 5/1989 | Segawa | 324/73.1 |
| 4,862,067 | 8/1989 | Brune et al. | 324/73.1 |
| 4,888,548 | 12/1989 | Chism | 371/22.5 |
| 4,918,379 | 4/1990 | Jougepier | 324/73.1 |
| 4,926,363 | 5/1990 | Nix | 324/73.1 |
| 4,975,641 | 12/1990 | Tanaka et al. | 371/22.5 |
| 5,073,907 | 12/1991 | Thomas, Jr. | |

OTHER PUBLICATIONS

Fink & Christiansen, Electronics Engineers' Handbook, 1989 F16.8–103, FIG. 13–15, pp. 8–66, FIG. 21–40.
AT&T Advance Data Sheet, "T7351 FDDI Physical Layer Device" Sep. 1990.

*Primary Examiner*—Jack B. Harvey
*Assistant Examiner*—Thomas Peeso
*Attorney, Agent, or Firm*—Townsend and Townsend Khourie and Crew

[57] ABSTRACT

A digital testing system providing for cost efficient comprehensive testing of very high frequency phase-locked loop performance parameters. The system tests PLL performance parameters both at integrated circuit level and communication board level. Cost efficiency of the testing system allows for volume testing by manufacturers.

20 Claims, 7 Drawing Sheets

DIGITAL TESTING TECHNIQUES FOR VERY HIGH FREQUENCY PHASE-LOCKED LOOPS

BACKGROUND OF THE INVENTION

The present invention relates to a digital testing system for high frequency digital Phase-Locked Loops (PLLs). This application is related to U.S. patent application Ser. No. 07/729,937, entitled "Digital Serial Loop Filter for High Frequency Control Systems" U.S. patent application Ser. No. 07/681,095, entitled "Digital Signed Phase to Frequency Converter for High Frequency Phase-Locked Loops", as well as U.S. patent application Ser. No. 07/730,228, describing a phase detector, U.S. patent application Ser. No. 07/,731,138 describing a phase error processor, and U.S. Pat. No. 5,132,633 describing a frequency controlled oscillator, all incorporated herein by reference for all purposes.

Testing of dynamic performance parameters of PLLs, at very high frequencies, requires time measurements in sub-nSeconds (e.g. clock jitter for 125 MHz PLLs would be on the order of 0.75 nS). Due to limited resolution, most automatic test equipment is not capable of making such measurements. This has made the dynamic testing of high frequency PLL performance parameters, at component level or at board level, a high-price-tag item for most manufacturers. Furthermore, volume testing has also been considered as difficult to achieve if these products are to remain price competitive. Therefore, the general approach in the industry has been one of "guaranteed by design" with ac/dc tests at the integrated circuit level and limited functionality tests at board level.

From the above it is seen that an improved device/-method for PLL testing is desired.

SUMMARY OF THE INVENTION

The present invention provides for cost efficient comprehensive testing of high frequency PLL dynamic performance at integrated circuit level and communication board level.

The test system transforms many high frequency dynamic signals within the PLL to moderate speed digital signals using a new generation PLL and a low cost digital tester. These digital signals are accessible through several on-chip (PLL) read/write ports allowing an external intelligent digital circuit (the digital tester) to compute the PLL dynamic performance. The low cost factor and the simplicity in the measurement system also allow the test system to be applicable to end-products that are in field servicing (on-site testing).

Accordingly, in one embodiment, the present invention provides a digital testing system for very high frequency PLLs comprising a PLL with interface means to facilitate communication of a plurality of internal signal information, a controller means for configuring the PLL as well as extracting and interpreting data from it, a communication means for connecting the PLL to the controller means, and means for generating a plurality of test patterns and monitoring test results connected to the PLL.

The present invention also provides, according to one embodiment, a method for digital testing of very high frequency dynamic PLL performance parameters. The method includes the steps of configuring the PLL in a selected mode through an interface in the PLL; applying a digital input pattern to an input terminal of the PLL; accessing a plurality of the PLL internal signal information through the interface; and extracting and interpreting the internal signal information with a digital tester via a communication means.

A further understanding maybe had with reference to the description and diagrams below.

BRIEF DESCRIPTION OF THE DRAWINGS

FIG. 4 shows signal diagrams for Receive Clock (RXC) jitter measurements, including measurements without noise (FIG. 4a) with noise (FIG. 4b), and RXC jitter measured by a phase meter (FIG. 4c);

DESCRIPTION OF THE PREFERRED EMBODIMENT

Figure 1:
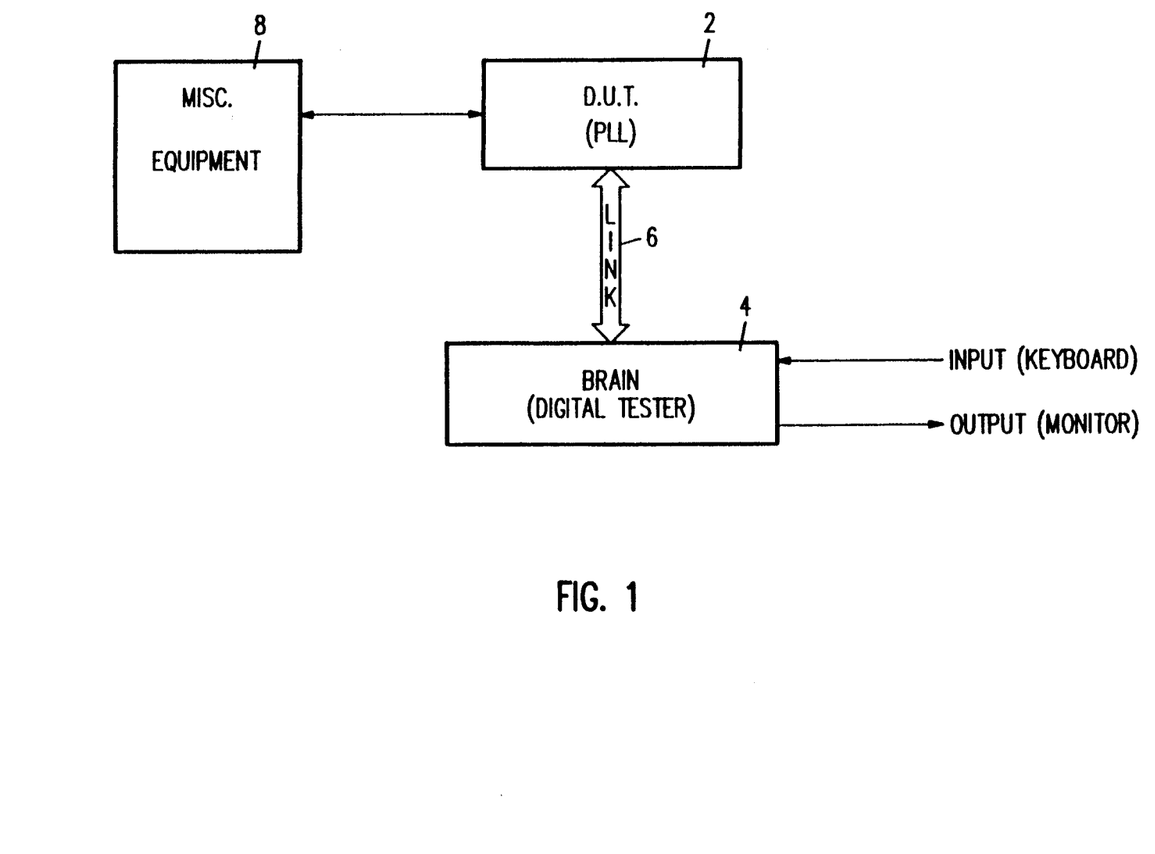
FIG. 1 is a basic block diagram of a test system.

The digital testing environment of the present invention includes four elements: a device under test (DUT) 2, a brain or digital tester 4, a link 6, and miscellaneous equipment 8. FIG. 1 illustrates the interconnection between these elements. The DUT 2 is a high frequency PLL. It is connected to the digital tester 4 via the bi-directional, serial/parallel, bus called link 6. The digital tester 4 is an intelligent digital hardware that configures the DUT 2 and extracts and interprets data from the DUT 2. Miscellaneous equipment 8 includes one or more of several common laboratory accessories such as oscilloscopes, pattern generators, or a spectrum analyzer which connect to the DUT 2.

Figure 2:
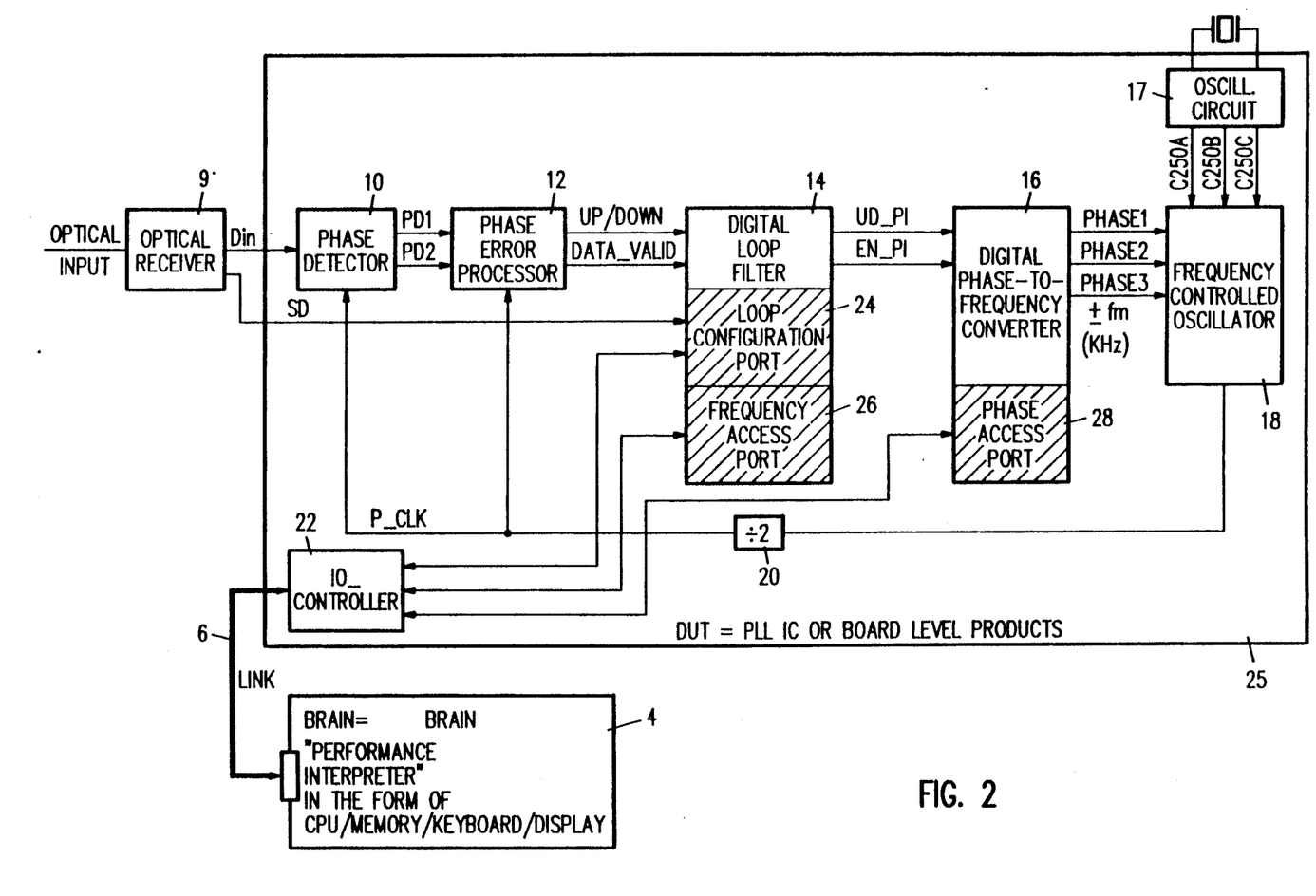
FIG. 2 is a block diagram of a digital test system of the present invention showing an internal block diagram of a PLL.

FIG. 2 is a block diagram of the present invention illustrating the details of the DUT 2 PLL. The DUT 2 PLL includes the following blocks, which in preferred embodiments are formed as an integrated circuit on a single die. An optical receiver 9 which receives, for example a 125 MBits/S optical input and converts it into an electrical digital signal Din at its output. A phase detector 10 receives the digital input signal Din as well as the PLL clock signal P_CLK and determines the phase error between the two signals. A phase error processor (PEP) 12 receives this phase information (at PD1 and PD2) and generates two serial digital signals (Up/Down and Data_Valid) that carry the phase error information. A digital loop filter 14 provides the interface between the PEP 12 and a phase to frequency converter (PFC) 16, which generates three equally phase-spaced low frequency control signals having a frequency fm representative of the phase error. A frequency controlled oscillator (FCO) 18 receives the PFC 16 outputs and three equally phase-spaced clock signals generated by a local crystal oscillator circuit 17, to generate a PLL phase-locked clock PLL CLK. A divide-by-2 circuit 20 receives the PLL_CLK signal (FCO 18 output) and generates the P_CLK signal ensuring a 50% duty cycle for the P_CLK signal. The device also includes an I/O controller 22 which serves as an interface between the tester 4 and the DUT 2. The DUT 2 PLL provides for read/write-able means to communicate digital test data between the different circuit blocks and the digital tester 4. For example the DUT PLL 2 in FIG. 2 includes the following three ports: a Loop Configuration Port (LCP) 24, a Frequency Access Port (FAP) 26, and a Phase Access Port (PAP) 28. An example of such digital PLL is described in U.S. patent application Ser. No. 07/729,937, entitled "Digital Serial Loop Filter for High Frequency Control Systems," previously incorporated by reference for all purposes and hereafter referred to as DPLL.

The loop filter 14 of the DPLL includes a scaler circuit, an integrator circuit and a summing circuit emulating a 1-pole/1-zero digital loop filter. The signal path through the scaler circuit is referred to as the proportional path, and the signal path through the integrator is referred to as the integral path. The loop filter also includes a loop configuration circuit which in response to the digital tester 4 programs and via the LCP 24 configures the loop type of the DUT 2. The DPLL, for example, provides for eight different types of loop configurations in a test mode (8 different combinations of close loop, open loop, and enable/disable proportional-/integral paths) as shown in Table 1. The output of the proportional path and both input and output of the integral path can be enabled or disabled via the LCP 24.

TABLE 1

| Test Modes | Loop Type | Proportional Output | Integral Input | Integral Output | Typical Usage |
|---|---|---|---|---|---|
| 0 | closed | enabled | enabled | enabled | normal |
| 1 | closed | enabled | — | enabled | test proportion path |
| 2 | open | — | — | enabled | test integral path |
| 3 | open | — | — | — | test FCO |
| 4 | open | enabled(−) | — | — | test loop filter |
| 5 | open | enabled(+) | — | — | test loop filter |
| 6 | open | — | enabled(−) | enabled | test loop filter |
| 7 | open | — | enabled(+) | enabled | test loop filter |

Figure 3A:
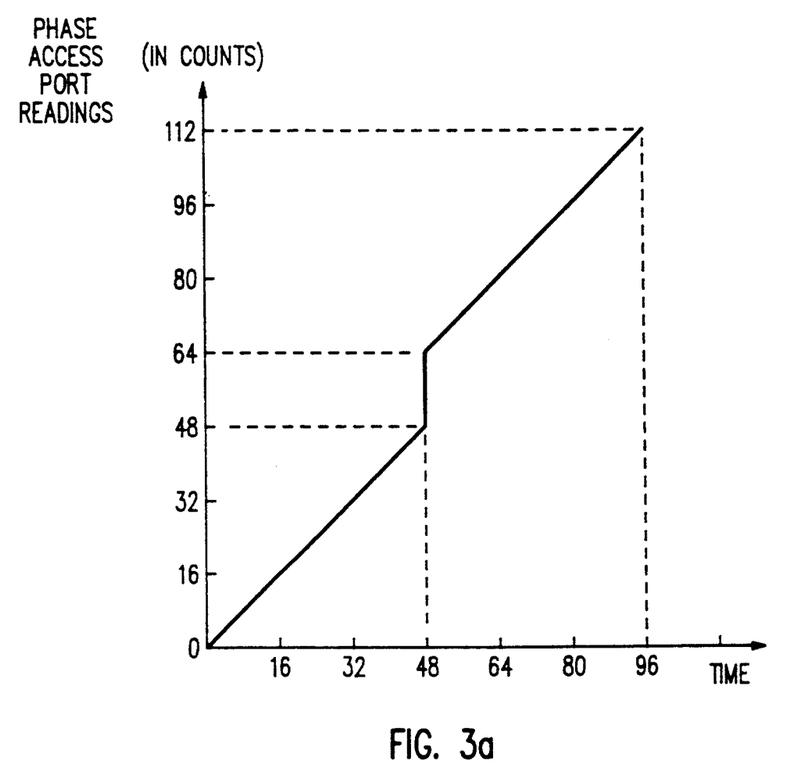
FIG. 3a shows a reading of a phase access port register and FIG. 3b is a corresponding phase to frequency converter output waveform.
Figure 3B:
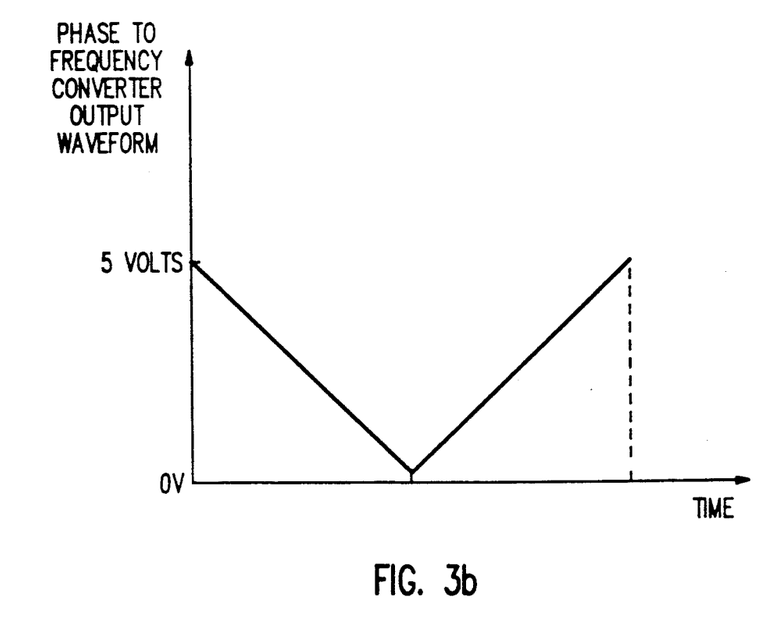

NOTE:
'—' = disabled
'enabled(−)' = enabled and forced in downward direction
'enabled(+)' = enabled and forced in upward direction The outputs of the digital integrator of the DPLL loop filter reflect the frequency difference between the local clock and the incoming data to the DPLL (Din). The integral signal content is accessible via the FAP 26 through which the digital tester 4 can either read the error frequency, or micro-step the frequency of P_CLK with a frequency resolution of, for example, 1.3 ppm of 125 MHz per binary step with a total of 256 steps. The PAP 28 reflects the low frequency output signals of the PFC 16 in digital format, which determines the phase settings of the high frequency output of the FCO 18. The PAP 28 contents indicate the digital counts of the sawtooth counting patterns of the PFC 16 which determines the output frequency of the 3-phase triangular analog waveforms of the PFC 16. FIG. 3a shows representative PAP 28 readings and FIG. 3b shows the corresponding PFC 16 output waveform plotted versus time. Because of the divide-by-2 circuit, two cycles of the PFC 16 output waveform correspond to one cycle of the P_CLK derived from the FCO 18. Via the PAP 28, the digital tester 4 can either read the phase setting of the P_CLK, or microstep the phase of P_CLK with a phase resolution of, for example, 42 pSec per binary step with a total of 192 steps.

The digital tester 4 is an intelligent digital controller circuit that performs the tests by configuring the loop type of the DUT 2 via the LCP 24, as well as extracting and interpreting data from the DUT 2 via the FAP 26 and PAP 28. The digital tester 4 can be in any one of the following forms depending on the application environment. For example, the digital tester 4 may be a handheld microprocessor-based controller with a keyboard and a multi-digit display which can be used for network servicing or for low-cost lab-quality engineering setups. A connection to a more powerful computer for enhanced performance is used in another embodiment for data presentation or data-logging. Another alternative is to use a micro/mini computer to perform board level outgoing qualification or device characterization. Onboard microprocessors for board level products are used in some embodiments for performing on-site remote diagnostics and margin tests for network maintenance purposes. Finally, the digital tester 4 can be any one of many digital automatic testers for enhanced PLL dynamic performance testing at integrated circuit level as well as board level outgoing qualification testing.

The link 6 connects the DUT 2 to the digital tester 4. Data flow is bidirectional and can be either serial or parallel. For the DPLL, for example, the link 6 is an 8-bit parallel standard microprocessor bus in one embodiment.

Several examples of specific tests measuring dynamic PLL performance parameters are discussed in the following embodiments. The arrangement for the following tests uses the DPLL as the DUT 2. Other high frequency PLL products designed with the means for providing the necessary information for testing purposes can be tested with this arrangement.

Figure 4A:
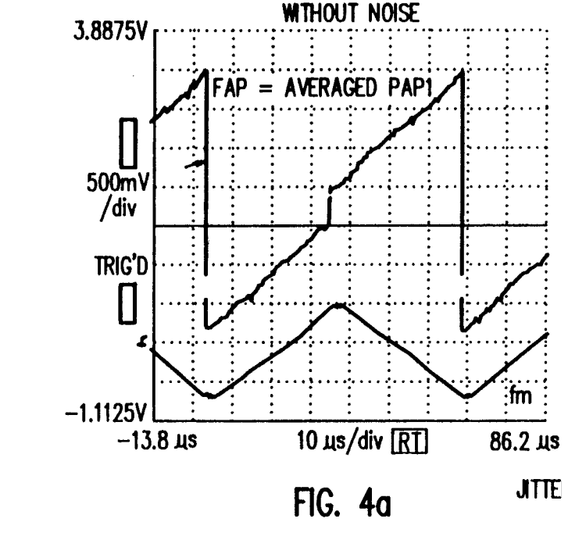
Figure 4B:
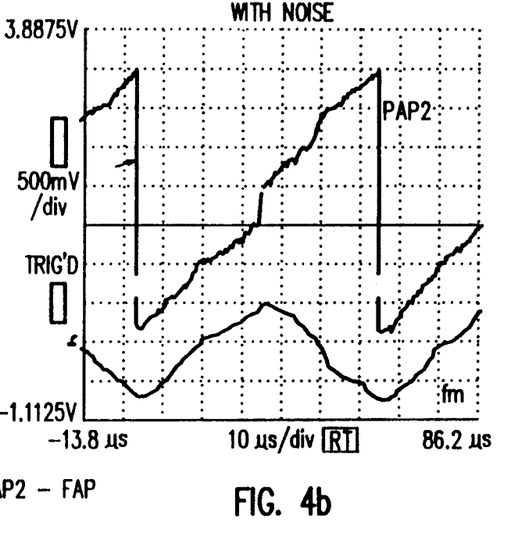
Figure 4C:
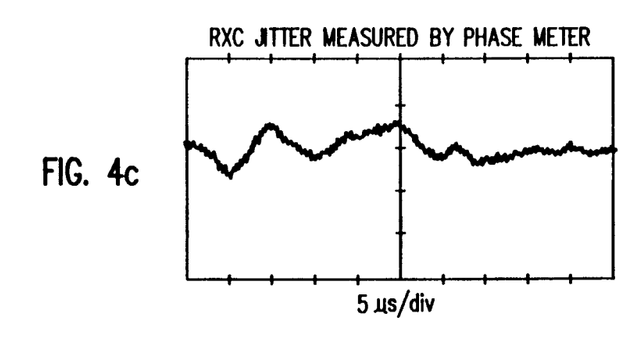

One of the more important performance parameters of any high frequency clock recovery PLL is the Recovered Clock (RXC) jitter. The RXC jitter is usually measured using an analog approach, either by monitoring the distribution of the edge transitions using an oscilloscope, or by keeping track of the minimum and maximum edge transitions over time using a phase meter. Due to the limited resolution of most automatic testers, measuring this parameter in out-going testers has been extremely difficult. The present invention solves this problem by providing a digital testing approach to measure RXC jitter. The RXC is one output of the DPLL and is available during normal PLL operation. To measure RXC jitter, first the digital tester 4 sets the DPLL loop filter to normal mode of operation (test mode 0 in Table 1) through LCP 24. A preconditioned input data pattern is next applied at the DPLL input (Din input on FIG. 2) for the PLL to acquire phase lock. The digital tester 4 then polls the contents of FAP 26 register to read the frequency difference between Din and the local clock generated by the local crystal. To enhance accuracy, the digital tester 4 averages several readings of FAP 26. Based on the average reading of FAP 26, the digital tester 4 calculates the expected output frequency (fm) of the PFC 16. Under the ideal conditions (no noise), this calculated result matches the PAP 28 readings which indicate the PFC 16 output signals in digital format. Under noisy conditions, RXC (or phase locked clock P_CLK) jitter is reflected by the distortion in the PFC 16 output waveforms. The digital tester 4 next polls PAP 28 to read actual instantaneous phase of PFC 16 output, which reflects the instantaneous phase setting of the P_CLK. By calculating the difference between the measured PAP 28 readings and the predicted PAP 28 contents, the peak-to-peak jitter can be measured with a resolution of 42 pSec per step in the difference. FIG. 4 illustrates this process. FIG. 4a shows the expected PAP 28 contents (after digital to analog conversion to monitor on an oscilloscope) on the upper waveform and the corresponding PFC 16 analog output waveform on the lower waveform. FIG. 4b shows the actual PAP 28 readings (with noise) with the corresponding analog output. And FIG. 4c shows the RXC jitter.

Figure 5:
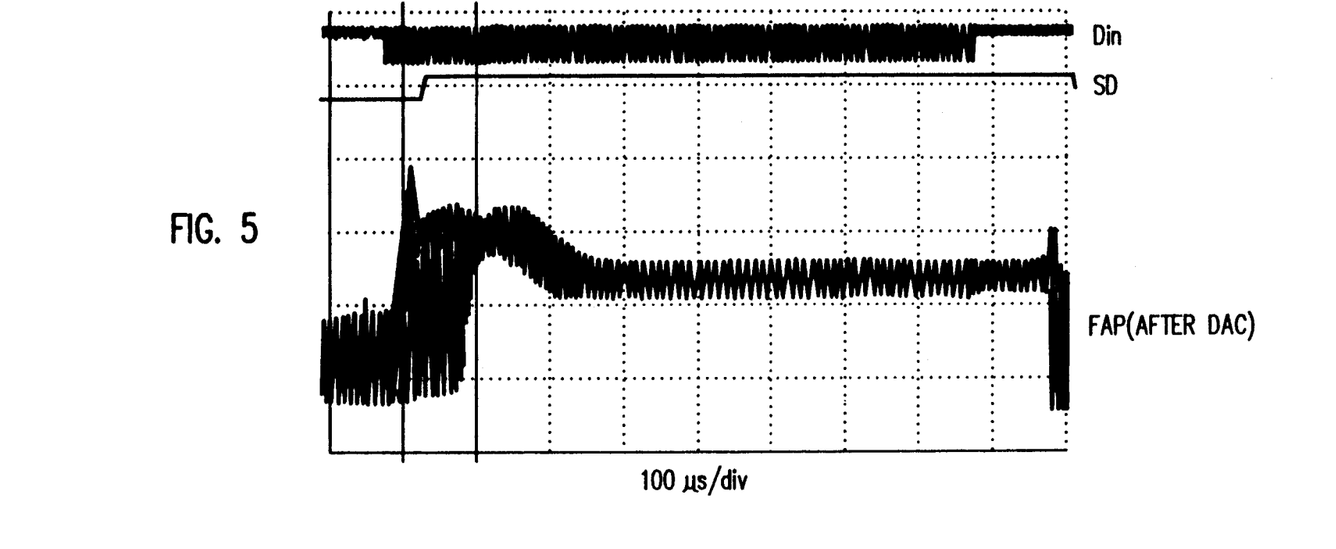
FIG. 5 is a timing diagram for frequency acquisition time measurements.

Acquisition time is another important PLL performance parameter. An optical receiver circuit in the DPLL generates a Signal Detect (SD) signal indicating the presence of data energy in the transmission medium as one bit of the PAP 28 register. To measure the acquisition time, first the digital tester 4 sets the loop configuration to normal PLL operation (test mode 0) through LCP 24. A burst data pattern is next applied to the DPLL input (Din). The digital tester 4 polls SD in the PAP 28 register and starts a timer when SD goes active. To measure frequency acquisition time, the digital tester 4 polls the FAP 26 register until the delta frequency between the input data and local clock becomes stable, indicating that the PLL is acquiring frequency locking. The time interval between the time SD goes active to the time a stable FAP 26 reading is made, is the acquisition time. FIG. 5 is a timing diagram showing the burst input signal (Din) on top, SD in the middle, and the FAP 26 output (after digital to analog conversion to monitor on an oscilloscope). In addition the digital tester 4 can poll the PAP 28 register for measuring the phase acquisition time.

Figure 6:
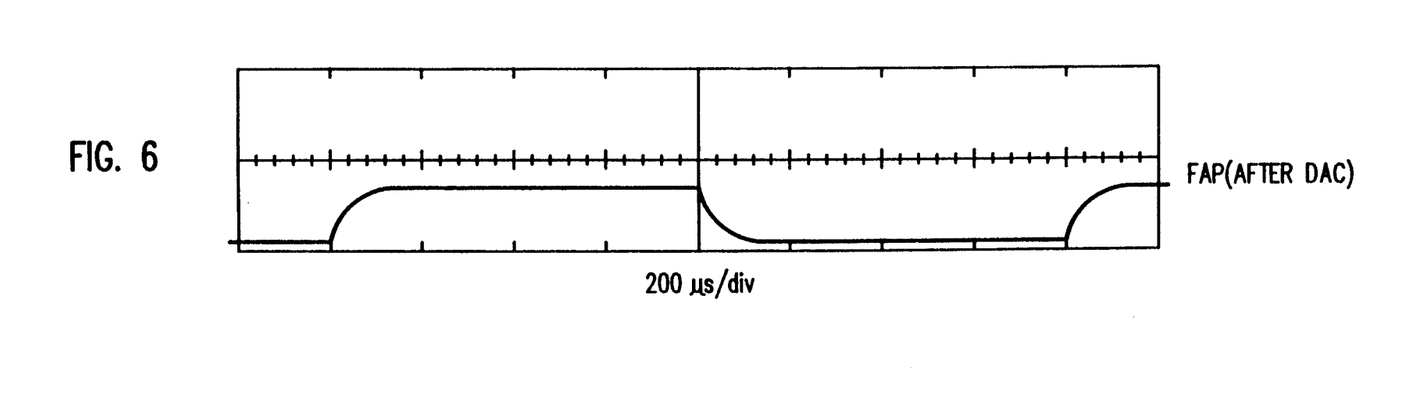
FIG. 6 shows a frequency step response of a PLL.

This system can measure the frequency step response of the DPLL with either external or internal excitation. The digital tester 4 first configures the loop to normal PLL operation (test mode 0) through the LCP 24. External excitation requires an external frequency step at the PLL 2 input (Din). Next, the digital tester 4 polls the FAP 26 register for frequency recovery. FIG. 6 shows the output of FAP 26 after digital to analog conversion. Alternatively, a simpler method to measure frequency step response is by means of internal excitation. A continuous data pattern is applied to the PLL 2 input (Din). After the PLL is in lock, the digital tester 4 reads FAP 26 for delta frequency between input data and local clock. A frequency offset value, equal to the desired frequency step divided by FAP 26 scaling factor of 1.3 ppm per step, is added to, or subtracted from, the above delta frequency value. The resulting number is written into the FAP 26 to change P_CLK by an amount equal to the frequency step as an internal excitation. The digital tester 4 then polls FAP 26 for a stable value as an indication of frequency recovery.

Figure 7A:
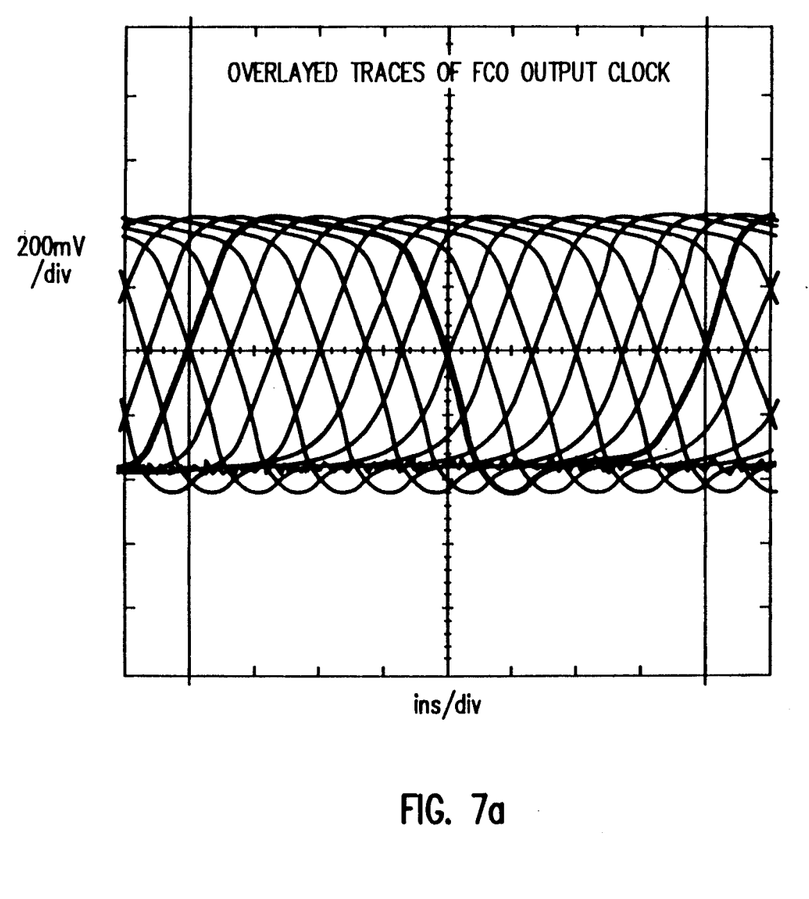
FIG. 7a shows overlayed traces of a PLL frequency controlled oscillator output clock and FIG. 7b is a phase step linearity plot for the frequency controlled oscillator.
Figure 7B:
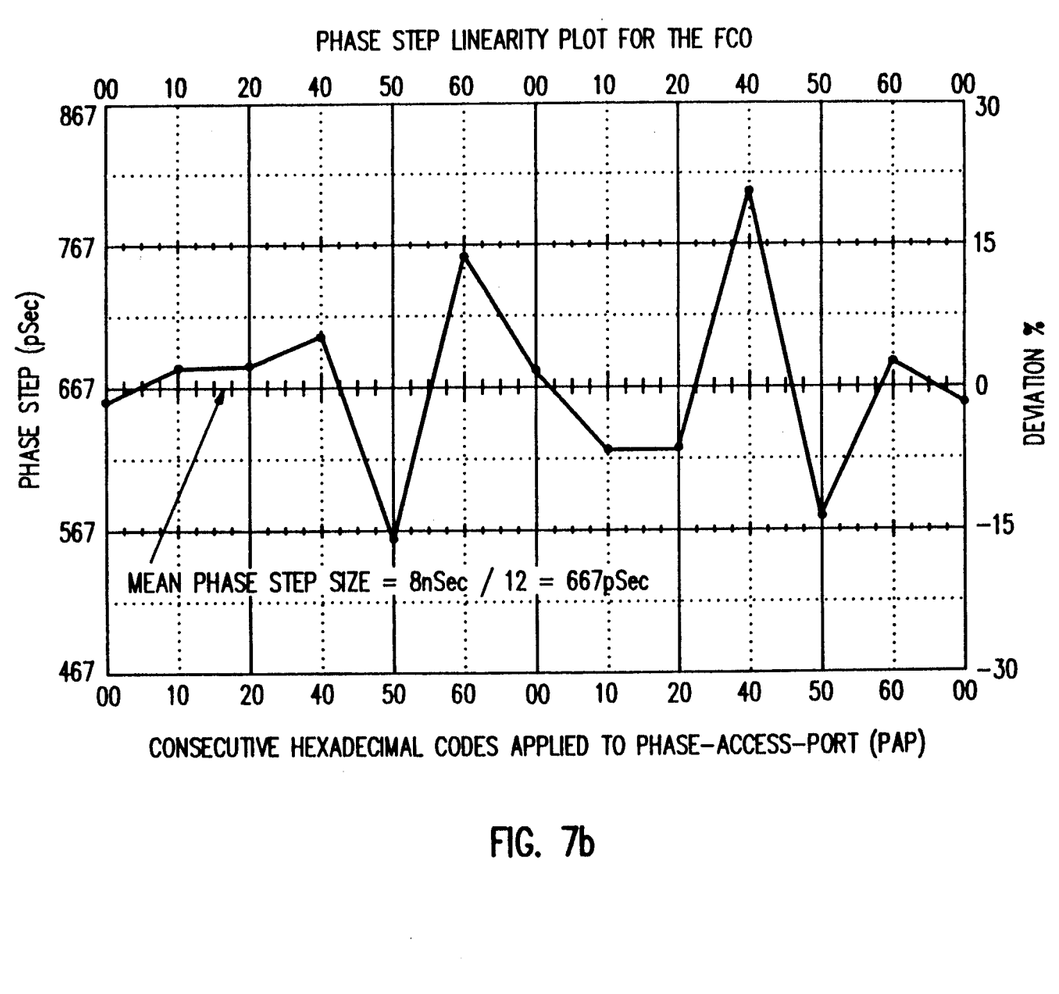

Checking the phase step linearity of P_CLK is another common test. For this test the DPLL is configured in an open loop mode, therefore the digital tester 4 first sets the DPLL to test mode 3. The digital tester 4 then micro-steps the FCO 18 output phase by writing to PAP 28 presetting the P_CLK to one of 92 phase steps. Using an oscilloscope the phase difference between adjacent steps can be measured as the digital tester 4 steps PAP 28. By entering the phase difference data for each step the phase step linearity versus phase steps can be plotted as in FIG. 7b for traces of FCO output clock shown in FIG. 7a.

To measure lock and cycle slipping the DPLL is set for tracking speed (in test mode 0) and an input data pattern is applied to the input Din. The digital tester 4 then polls the PAP 28 continuously and calculates an average frequency value (fm) for the PFC 16 output signal. The digital tester 4 next checks the uniformity of fm period measurements. Any erroneous reading of fm indicates cycle slippings, and if there is no cycle slipping over a predefined period of time, then lock has been acquired.

Window truncation and static alignment error are tested by first setting the DPLL in test mode 0 and selecting the tracking speed. An input data pattern synchronized to the DPLL local crystal frequency is applied to the Din input. Next, the digital tester 4 polls the PAP 28 and averages several readings to enhance accuracy. The DPLL is then set in test mode 3 (open loop, with both integral and proportional path disabled, see Table 1). The digital tester 4 steps PAP 28 forward until RXD shows corrupted data. This process is also repeated for the opposite direction. Based on the results of the phase linearity test, phase corrections can be applied to the results of this test to calculate window truncations and static alignment error.

The above are only several examples of how to test some PLL dynamic performance parameters. The test system of the present invention can also test many of the other PLL performance parameters by altering and combining the various test configurations. Table 2 lists the various tests necessary to ensure the proper functioning of a typical PLL circuit in most applications and a procedure for conducting the test.

TABLE 2

| Test | Test Mode | Procedure |
|---|---|---|
| FCO clock spectral purity | 2 | set brain 4 to step FAP 26, set a spectrum analyzer (connected to RXC) to check FCO 18 clock spectral purity, repeat for other settings of FAP. |
| Xtal frequency without using a frequency counter | 2 | set brain 4 to write max frequency (fm = 163/4 KHz) to FAP 26, set brain 4 to count PAP 28 cycles over interval of seconds, use brain 4 Xtal (calibrated for accuracy) to time interval, (measured fm × DPLL scaling factor) = Xtal frequency. (non-volatile memory + on-board CPU) for Xtal aging studies. |
| Frequency difference between the local Xtal and input signal | 0 | apply input data to DPLL, set brain 4 to read FAP 26, set brain 4 to average several readings for enhanced accuracy. |
| Lock ranges (proportional path) | 1 | select DPLL tracking speed, set brain 4 to center FAP 26, apply input data to DPLL, change input data frequency to desired limits, set brain 4 to search for cycle slippage. |
| Lock ranges (proportional & integral paths) | 0 | select DPLL tracking speed, apply input data to DPLL, change input data pattern frequency to desired limits, set brain 4 to search for cycle slippage. |
| Proportional lock | 1 | set DPLL tracking speed to |

TABLE 2-continued

| Test | Test Mode | Procedure |
|---|---|---|
| ranges with fixed input frequency | | slowest setting, apply input data to DPLL, set brain 4 to read FAP 26, set brain 4 to average several readings for enhanced accuracy. set brain 4 to write FAP 26 to (mean FAP reading +/− delta frequency), set brain 4 to search for cycle slippage. |
| Phase-step response | 0 | select DPLL tracking speed, apply input data to DPLL, set brain 4 to poll PAP 28 and compute sign of fm & stepping rate, set brain 4 to predict PAP 28 readings, set brain 4 to slew PAP 28 (to prevent phase ambiguity) stop brain 4 until PAP 28 reaches (predicted PAP +/− delta phase), set brain 4 to poll PAP 28 for phase recovery. |
| DPLL logic quick | 4–7 | set brain 4 to read fm, or use external oscilloscope/frequency counter to monitor clock signal at RXC. |

In conclusion, the present invention offers a digital testing system for evaluating and volume-testing of very high frequency PLLs at integrated circuit level as well as on communication boards. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A digital testing system for testing of very high frequency dynamic phase-locked loop (PLL) performance parameters comprising:
   a PLL with interface means to facilitate communication of a plurality of internal test information;
   a controller means for configuring said PLL as well as extracting and interpreting data from said PLL;
   a communication means for connecting said PLL to said controller means; and
   a pattern generator and monitoring means, coupled to said PLL, for generating a plurality of test patterns inputted into said PLL and for monitoring test results outputted from said PLL.

2. A testing system as recited in claim 1, wherein said PLL comprises:
   a receiver circuit for receipt of a high frequency input signal;
   a phase detector having a first input for receipt of said high frequency input signal via said receiver circuit, and a second input for receipt of a loop clock signal, said phase detector determining a phase error value between said input signal and said loop clock signal;
   a phase error processor for receiving said phase error value from said phase detector, and transforming said phase error value into two serial phase error processor output signals ready for digital filtering; and
   a digital serial loop filter having two inputs to receive said two serial phase error processor output signals and tow digital serial loop filter output signals, said digital serial loop filter for filtering said two serial phase error processor output signals.

3. A system as recited in claim 2 wherein said digital serial loop filter further comprises:
   a loop configuration interface providing access to said digital serial loop filter for configuring a loop type of said PLL; and
   a frequency access read/write interface means providing access to said digital serial loop filter for reading a frequency difference between a local crystal and said high frequency input signal to said PLL, or micro-stepping a free-running frequency of a voltage-controlled oscillator or a frequency-controlled oscillator of said PLL.

4. A system as recited in claim 2 wherein said PLL is fabricated on a single semiconductor die.

5. A digital testing system as recited in claim 1 wherein said controller means is a microprocessor-based controller.

6. A digital testing system as recited in claim 1 wherein said communication means is a bidirectional, parallel, multibit bus.

7. A testing system as recited in claim 2, wherein said PLL further comprises:
   a phase converter having two inputs for receiving said two digital serial loop filter output signals, said phase converter generating one of a voltage or a frequency output signal at an output;
   an oscillator circuit for generating a local clock signal;
   a voltage-controlled or a frequency-controlled oscillator followed by a divide-by-two circuit for receiving said phase converter output signal and said local clock signal and generating said loop clock signal.

8. A system as recited in claim 7 wherein said phase converter further comprises:
   a phase access read/write interface providing access to said phase converter for reading a plurality of phase settings of either a voltage-controlled oscillator or a frequency-controlled oscillator (FCO) of a PLL, or micro-stepping a phase of said VCO or FCO.

9. A testing system as recited in claim 7, wherein said PLL further comprises:
   an input/output controller controlling an interface between said controller means and said digital serial loop filter and said phase converter; and
   a multi-bit directional bus providing for said interface between said controller means and said digital serial loop filter and said phase converter.

10. A testing system as recited in claim 2, wherein said digital serial loop filter includes programmable loop variables, and provides filtering by processing a pulse density of said two serial phase error processor output signals.

11. A method for digital testing of very high frequency (VHF) dynamic phase-locked loop (PLL) performance parameters comprising the steps of:
    configuring said PLL in a selected mode through an interface in said PLL;
    applying a digital input pattern to an input terminal of said PLL;
    accessing internal signal information of said PLL through said interface; and extracting and interpreting said internal signal information with a digital tester via a communication means.

12. A method as in claim 11 wherein said step of configuring said PLL in a selected mode through an interface in said PLL, comprises the step of configuring said PLL in a selected mode through a loop configuration port of said interface.

13. A method as in claim 11 wherein said step of accessing said PLL internal signal information through said interface comprises the steps of:
   accessing PLL phase information through a phase port of said interface; and
   accessing PLL frequency information though a frequency port of said interface.

14. A method as in claim 11 for digitally testing a recovered clock jitter of said PLL:
   a) wherein said step of configuring said PLL is a step of configuring a PLL loop filter for a normal mode of operation through a loop configuration port of said interface; and
   b) wherein said steps of accessing, extracting and interpreting said internal signal information with a digital tester via a communication means further comprise the steps of:
      i) reading a frequency difference between an input data and a PLL local clock signal through a frequency port of said interface;
      ii) calculating an expected output frequency of a PLL phase-to-frequency converter based on said frequency difference;
      iii) reading an actual output frequency of said phase-to-frequency converter through a phase port of said interface; and
      iv) measuring a peak-to-peak jitter of recovered clock by calculating a difference between said actual output frequency and said expected output frequency.

15. A method as in claim 14 for digitally testing an acquisition time of said PLL;
   a) wherein said step of configuring said PLL is a step of configuring a loop filter of said PLL for normal mode of operation through a loop configuration port of said interface;
   b) wherein said step of applying a digital input pattern to an input terminal of said PLL is a step of applying a burst data pattern; and
   c) wherein said steps of accessing, extracting and interpreting said internal signal information with a digital tester via a communication means further comprise the steps of:
      i) monitoring a signal detect (SD) signal activated by a receiver circuit of said PLL upon detection of data energy in a transmission medium connected to said PLL input terminal, and starting a timer when said SD signal is activated;
      ii) reading a frequency difference value between said input data and a PLL local clock through a frequency port of said interface until said frequency difference value stabilizes indicating said PLL is acquiring lock; and
      iii) measuring a time interval between a time of first SD activation and a time of first PLL acquiring lock to determine said PLL acquisition time.

16. A method as in claim 11 for digitally testing a frequency step response of said PLL using an external excitation:
   a) wherein said step of configuring said PLL is a step of configuring a PLL loop filter for normal mode of operation through a loop configuration port of said interface;
   b) wherein said step of applying a digital input pattern to an input terminal of said PLL is a step of applying a frequency step input signal; and
   c) wherein said steps of accessing, extracting and interpreting said internal signal information with a digital tester via a communication means comprise a step of reading a recovered frequency through a frequency port of said interface.

17. A method as in claim 11 for digitally testing a frequency step response of said PLL using an internal excitation;
   a) wherein said step of configuring said PLL is a step of configuring a PLL loop filter for normal mode of operation through a loop configuration port of said interface;
   b) wherein said step of applying a digital input pattern to an input terminal of said PLL is a step of applying a continuous data pattern; and
   c) wherein said step of accessing, extracting and interpreting said internal signal information with a digital tester via a communication means further comprise the steps of:
      i) reading a frequency difference value between said continuous data pattern and a PLL local clock after said PLL has acquired a lock status, through a frequency port of said interface;
      ii) generating a frequency step value as an internal excitation, by adding to, or subtracting from, said frequency difference value a frequency offset value equal to a desired frequency step divided by a scaling factor of said frequency port of said interface;
      iii) changing a recovered frequency value by an amount equal to said frequency step value by writing said frequency step value into said frequency port of said interface; and
      iv) reading a recovered frequency through said frequency port of said interface.

18. A method as recited in claim 11 for digitally testing a phase step linearity of said PLL;
   a) wherein said step of configuring said PLL is a step of configuring a PLL loop filter for an open loop mode of operation through a loop configuration port of said interface;
   b) wherein said steps of accessing, extracting and interpreting said internal signal information with a digital tester via a communication mans further comprises the steps of:
      i) micro-stepping a PLL frequency controlled oscillator output to preset a phase of a PLL recovered clock, by writing to a phase port of said interface; and
      ii) measuring a phase difference between adjacent steps to determine phase linearity.

19. A method as recited in claim 11 for digitally testing lock and cycle slipping said PLL:
   a) wherein said step of configuring said PLL is a step of configuring a PLL loop filter for normal mode of operation through a loop configuration port of said interface; and
   b) wherein said steps of accessing, extracting and interpreting said internal signal information with a digital tester via a communication means further comprise the steps of:

i) reading a PLL phase-to-frequency converter output signal and calculating an average value for a period of said output signal; and ii) checking a uniformity of said period calculations and determining said cycle slippings upon nonuniformity or said lock status upon uniformity of calculations.

20. A method as recited in claim 11 for digitally testing window truncation and static alignment error of said PLL:

a) wherein said step of configuring said PLL is a step of configuring a PLL loop filter for normal mode of operation through a loop configuration port of said interface;

b) wherein said step of applying a digital input pattern to an input terminal of said PLL is a step of applying an input data pattern synchronized to a local crystal frequency of said PLL; and c) wherein said steps of accessing, extracting and interpreting said internal signal information with a digital tester via a communication means further comprise the steps of:

i) reading a PLL phase-to-frequency converter output frequency through a phase port of said interface;

ii) configuring said PLL in an open loop mode of operation with a PLL filter integral path and proportional path disabled;

iii) corrupting a PLL recovered data signal by stepping a phase of a PLL recovered clock through a phase port of said interface, to produce a corrupted recovered data; and iv) applying a plurality of phase corrections to said corrupted recovered data based on a results of a phase linearity test.

* * * * *